(12) United States Patent
Bisschops et al.

(10) Patent No.: US 6,618,122 B2
(45) Date of Patent: Sep. 9, 2003

(54) MOVABLE SUPPORT IN A VACUUM CHAMBER AND ITS APPLICATION IN LITHOGRAPHIC PROJECTION APPARATUSES

(75) Inventors: Theodorus H. J. Bisschops, Eindhoven (NL); Hermanus M. J. R. Soemers, Mierlo (NL); Jakob Vijfvinkel, Eindhoven (NL); Johannes C. Driessen, Eindhoven (NL); Michael J. M. Renkens, Geleen (NL); Adrianus G. Bouwer, Nuenen (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 10/171,638

(22) Filed: Jun. 17, 2002

(65) Prior Publication Data
US 2002/0163630 A1 Nov. 7, 2002

Related U.S. Application Data

(63) Continuation of application No. 09/551,224, filed on Apr. 17, 2000, now Pat. No. 6,421,112.

(30) Foreign Application Priority Data
Apr. 19, 1999 (EP) .............................. 99201219

(51) Int. Cl.[7] ........................ G03B 27/58; G03B 27/42; G03B 27/62
(52) U.S. Cl. ............................ 355/72; 355/53; 355/75
(58) Field of Search ................. 355/53, 72–76; 310/10, 12; 378/34, 35; 318/625–628

(56) References Cited

U.S. PATENT DOCUMENTS

| 4,191,385 A | | 3/1980 | Fox et al. | |
|---|---|---|---|---|
| 4,768,911 A | | 9/1988 | Balter | |
| 4,993,696 A | | 2/1991 | Furukawa | |
| 4,998,859 A | | 3/1991 | Oshima et al. | |
| 5,134,640 A | | 7/1992 | Hirokawa et al. | |
| 5,218,896 A | | 6/1993 | Furukawa | |
| 5,467,720 A | * | 11/1995 | Korenaga et al. | 108/20 |
| 5,608,773 A | | 3/1997 | Korenaga et al. | 378/34 |
| 5,784,925 A | | 7/1998 | Trost et al. | |
| 5,820,104 A | | 10/1998 | Koyano et al. | |
| 5,898,179 A | | 4/1999 | Smick et al. | |
| 5,899,653 A | | 5/1999 | Brodine | |
| 5,909,272 A | * | 6/1999 | Osanai et al. | 355/53 |
| 6,064,467 A | | 5/2000 | Takizawa | 355/53 |
| 6,323,935 B1 | | 11/2001 | Ebihara et al. | 355/53 |

FOREIGN PATENT DOCUMENTS

GB    2 096 247 A    10/1982

OTHER PUBLICATIONS

Ceglio et al., Front–end design issues, 2219 Applied Optics, Dec. 1, 1993, vol. 32, No. 34, pp. 7050–7056.

* cited by examiner

Primary Examiner—Henry Hung Nguyen
(74) Attorney, Agent, or Firm—Pillsbury Winthrop LLP

(57) ABSTRACT

An object table is supported in a vacuum chamber by an elongate beam or beams extending through elongate slots in opposite walls of the vacuum chamber. Displacement of the beam in two orthogonal directions is achieved by displacing the beam laterally and longitudinally. The elongate slots are sealed by sliding plates supported by a gas bearing. The beam is driven longitudinally by linear motors acting against between a balance mass and the beam. The beam is driven laterally by linear motors acting between a balance mass and the sliding plates. The two balance masses may be separate or combined.

20 Claims, 5 Drawing Sheets

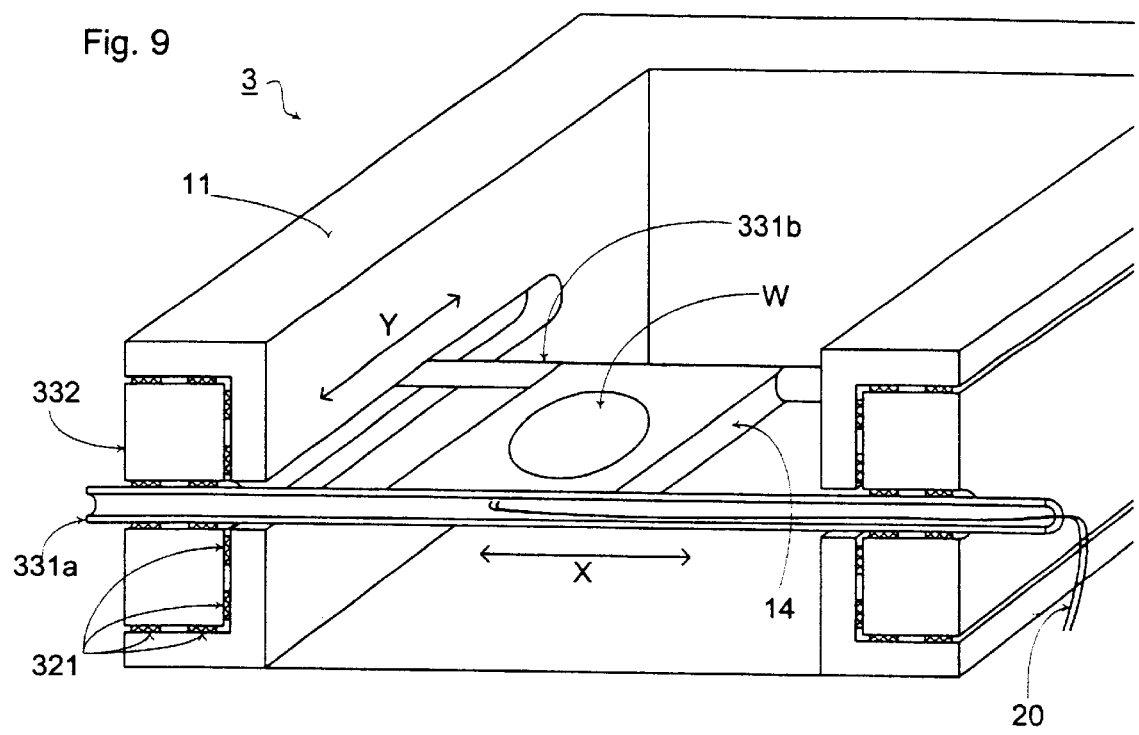

MOVABLE SUPPORT IN A VACUUM CHAMBER AND ITS APPLICATION IN LITHOGRAPHIC PROJECTION APPARATUSES

This is a Continuation of National Application No. 09/551,224 filed Apr. 17, 2000, now U.S. Pat. No. 6,421,112 the entire contents of which is hereby incorporated by reference.

BACKGROUND OF THE INVENTION

1. Field of the Invention

The present invention relates to a support mechanism for an object in a vacuum chamber whereby motion can be fed through into the vacuum chamber from the exterior. More particularly, the invention relates to the application of such devices in lithographic projection apparatuses.

2. Description of Related Art

For the sake of simplicity, the projection system may hereinafter be referred to as the "lens"; however, this term should be broadly interpreted as encompassing various types of projection system, including refractive optics, reflective optics, catadioptric systems, and charged particle optics, for example. The radiation system may also include elements operating according to any of these principles for directing, shaping or controlling the projection beam of radiation, and such elements may also be referred to below, collectively or singularly, as a "lens". In addition, the first and second object tables may be referred to as the "mask table" and the "substrate table", respectively. Further, the lithographic apparatus may be of a type having two or more mask tables and/or two or more substrate tables. In such "multiple stage" devices the additional tables may be used in parallel, or preparatory steps may be carried out on one or more stages while one or more other stages are being used for exposures. Twin stage lithographic apparatuses are described in International patent Applications WO 98/28665 and WO 98/40791, for example.

Lithographic projection apparatuses can be used, for example, in the manufacture of integrated circuits (ICs). In such a case, the mask (reticle) may contain a circuit pattern corresponding to an individual layer of the IC, and this pattern can be imaged onto a target area (die) on a substrate (silicon wafer) which has been coated with a layer of photosensitive material (resist). In general, a single wafer will contain a whole network of adjacent dies which are successively irradiated via the reticle, one at a time. In one type of lithographic projection apparatus, each die is irradiated by exposing the entire reticle pattern onto the die in one go; such an apparatus is commonly referred to as a wafer stepper. In an alternative apparatus—which is commonly referred to as a step-and-scan apparatus—each die is irradiated by progressively scanning the reticle pattern under the projection beam in a given reference direction (the "scanning" direction) while synchronously scanning the wafer table parallel or anti-parallel to this direction; since, in general, the projection system will have a magnification factor M (generally<1), the speed v at which the wafer table is scanned will be a factor M times that at which the reticle table is scanned. More information with regard to lithographic devices as here described can be gleaned from International Patent Application WO 97/33205.

In a lithographic apparatus, the size of features that can be imaged onto the wafer is limited by the wavelength of the projection radiation. To produce integrated circuits with a higher density of devices and hence higher operating speeds, it is desirable to be able to image smaller features. Whilst most current lithographic projection apparatuses employ ultraviolet light generated by mercury lamps or excimer lasers, it has been proposed to use shorter wavelength radiation of around 13 nm. Such radiation is termed extreme ultraviolet (EUV) or soft x-ray, and possible sources include laser plasma sources or synchrotron radiation from electron storage rings. An outline design of a lithographic projection apparatus using synchrotron radiation is described in "Synchrotron radiation sources and condensers for projection x-ray lithography", J B Murphy et al, Applied Optics Vol. 32 No. 24 pp 6920–6929 (1993).

Other proposed radiation types include electron beams and ion beams. These types of beam share with EUV the requirement that the beam path, including the mask, substrate and optical components, be kept in a high vacuum. This is to prevent absorption and/or scattering of the beam, whereby a total pressure of less than about $10^{-6}$ millibar is typically necessary for such charged particle beams. Wafers can be contaminated, and optical elements for EUV radiation can be spoiled, by the deposition of carbon layers on their surface, which imposes the additional requirement that hydrocarbon partial pressures should generally be kept below $10^{-8}$ or $10^{-9}$ millibar. Otherwise, for apparatus using EUV radiation, the total vacuum pressure need only be $10^{-3}$ or $10^{-4}$ mbar, which would typically be considered a rough vacuum.

Further information with regard to the use of electron beams in lithography can be gleaned, for example, from U.S. Pat. Nos. 5,079,122 and 5,260,151, as well as from EP-A 0 965 888.

Working in such a high vacuum imposes quite onerous conditions on the components that must be put into the vacuum and on the vacuum chamber seals, especially those around any part of the apparatus where a motion must be fed-through to components inside the chamber from the exterior. For components inside the chamber, materials that minimize or eliminate contaminant and total outgassing, i.e. both outgassing from the materials themselves and from gases adsorbed on their surfaces, should be used. It would be very desirable to be able to reduce or circumvent such restrictions.

SUMMARY OF THE INVENTION

It is an object of the present invention to provide an improved support mechanism for an object table of a lithographic projection apparatus having a vacuum chamber whereby motion can be fed-through to allow control from the outside of the vacuum chamber of the position of the object table in the chamber.

According to the present invention, these and other object are achieved in a lithographic projection apparatus that has: a radiation system for supplying a projection beam of radiation; a first object table provided with a mask holder for holding a mask; a second object table provided with a substrate holder for holding a substrate; and a projection system for imaging an irradiated portion of the mask onto a target portion of the substrate. The lithographic projection apparatus also has a vacuum chamber having a wall enclosing at least one of the first and second object tables, the vacuum chamber wall having at least one wall aperture therein; an elongate beam extending through the wall aperture, a part of said beam extending into the vacuum chamber to support the one object table therein and a part of the beam extending outside the vacuum chamber, whereby displacement of the beam outside said vacuum chamber causes displacement of the beam; and positioning means for displacing the beam, thereby to displace the object table within the vacuum chamber.

Current lithography apparatuses are designed for use in clean room environments and therefore some steps have conventionally been taken to reduce possible sources of contamination of wafers that are processed by the apparatus. However, conventional designs of wafer, mask and transfer stages are very complicated and employ large numbers of components for sensor and drive arrangements. Such stages also need to be provided with large numbers of signal and control cables and other utilities. The present invention avoids the difficult and detailed task of making such large numbers of components vacuum-compatible, or replacing them with vacuum-compatible equivalents, by adopting the principle of locating as many components and functions as possible outside the vacuum chamber. The present invention thus avoids the need to vacuum-proof many or most of the numerous components, by providing appropriate mechanical feed-throughs with innovative sealing arrangements. Likewise, the present invention avoids difficulties in reducing vibrations inevitable in vacuum apparatuses, particularly where powerful pumps are provided, by isolating as far as possible vibration sensitive components from the vacuum chamber wall.

In a preferred embodiment of the invention, the aperture(s) comprises an elongate slot sealed by a sliding plate whereby the object or object table is displaceable in two orthogonal directions by lateral and longitudinal displacement of the beam. Preferably the beam is directly driven by a linear motor for longitudinal displacement and is driven via the sliding plate for lateral movement. The linear motors preferably act against balance masses which may be separate or combined.

The present invention also provides a device manufacturing method. The device manufacturing method also includes, during the step of projecting an image, at least one of the mask and substrate are mounted on an object table accommodated in a vacuum chamber having a wall, the vacuum chamber wall having at least one wall aperture therein; the object table being supported by an elongate beam extending through the wall aperture, a part of the beam extending into the vacuum chamber to support the object table therein and a part of the beam extending outside the vacuum chamber, whereby displacement of the beam outside the vacuum chamber causes displacement of the object inside the vacuum chamber; the wall aperture being sealed by a seal allowing displacement of the beam; and the object table being positioned by positioning means for displacing the beam, thereby to displace the object table within the vacuum chamber.

In a manufacturing process using a lithographic projection apparatus according to the invention a pattern in a mask is imaged onto a substrate which is at least partially covered by a layer of energy-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallisation, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4.

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target area", respectively.

BRIEF DESCRIPTION OF THE DRAWINGS

The present invention and its attendant advantages will be described below with reference to exemplary embodiments and the accompanying schematic drawings, in which:

FIG. 9 is a part-sectional perspective view of a wafer stage of a lithographic projection apparatus according to a third embodiment of the invention.

DETAILED DESCRIPTION OF THE PREFERRED EMBODIMENTS

In the various drawings, like parts are indicated by like references.

Embodiment 1

Figure 1:
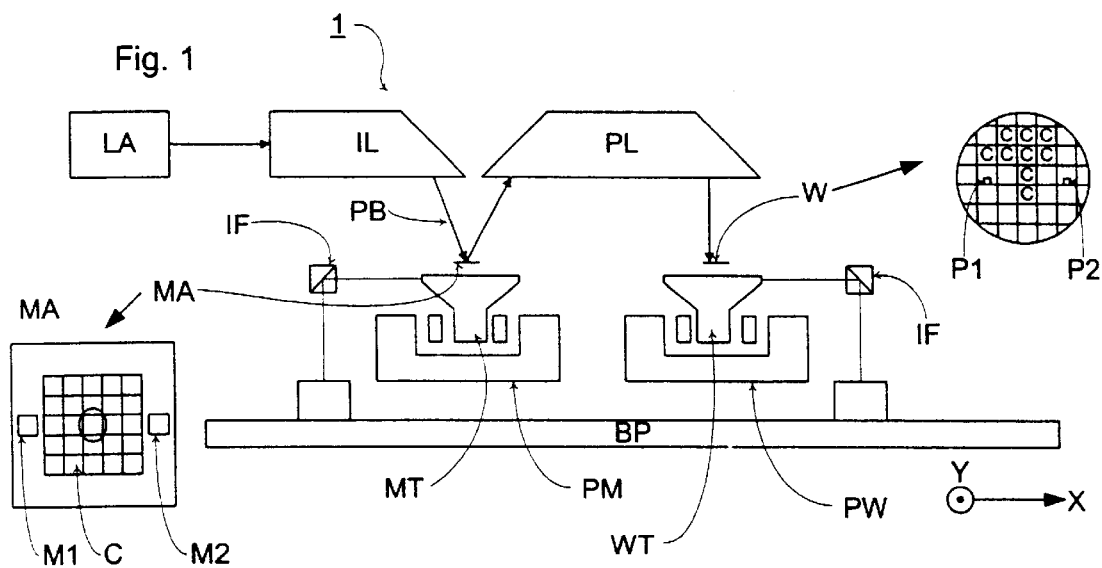
FIG. 1 depicts a lithographic projection apparatus according to a first embodiment of the invention.

FIG. 1 schematically depicts a lithographic projection apparatus 1 according to the invention. As here depicted, the apparatus uses reflective components; however, such components may also be transmissive. The apparatus comprises:

a radiation system LA, IL for supplying a projection beam PB of radiation (e.g. UV or EUV radiation, electrons or ions);

a first object table (mask table) MT provided with a mask holder for holding a mask MS (e.g. a reticle), and connected to a first positioning component PM for accurately positioning the mask with respect to item PL;

a second object table (substrate table) WT provided with a substrate holder for holding a substrate W (e.g. a resist-coated silicon wafer), and connected to a second positioning component PW for accurately positioning the substrate with respect to item PL;

a projection system ("lens") PL (e.g. a refractive or catadioptric system, a mirror group or an array of field deflectors) for imaging an irradiated portion of the mask MA onto a target portion C (die) of the substrate W.

The radiation system comprises a source LA (e.g. an undulator or wiggler provided around the path of an electron beam in a storage ring or synchrotron, a plasma source, or an electron or ion beam source) which produces a beam of radiation. This beam is passed along various optical components included in illumination system IL, e.g. for the purpose of shaping and/or collimating the resultant beam PB, and/or making it uniformly intense throughout its cross-section.

The beam PB subsequently impinges upon the mask MA which is held in a mask holder on a mask table MT. Having been selectively reflected (or transmitted) by the mask MA, the beam PB passes through the "lens" PL, which focuses the beam PB onto a target area C of the substrate W. With the aid of the positioning component PW and the interferometric displacement measuring device IF, the substrate table WT can be moved accurately, e.g. so as to position different target areas C in the path of the beam PB. Similarly, the positioning means PM and the interferometric displacement measuring device IF can be used to accurately position the mask MA with respect to the path of the beam PB, e.g. after mechanical retrieval of the mask MA from a mask library or during a scanning motion. In general, movement of the object tables MT, WT will be realized with the aid of a long stroke module (course positioning) and a short stroke module (fine positioning), which are not explicitly depicted in FIG. 1.

The depicted apparatus can be used in two different modes:

In step mode, the mask table MT is kept essentially stationary, and an entire mask image is projected in one go (i.e. a single "flash") onto a target area C. The substrate table WT is then shifted in the X and/or Y directions so that a different target area C can be irradiated by the beam PB;

In scan mode, essentially the same scenario applies, except that a given target area C is not exposed in a single "flash". Instead, the mask table MT is movable in a given direction (the so-called "scan direction", e.g. the X direction) with a speed v, so that the projection beam PB is caused to scan over a mask image; concurrently, the substrate table WT is simultaneously moved in the same or opposite direction at a speed V=Mv, in which M is the magnification of the lens PL (e.g., M=¼ or ⅕). In this manner, a relatively large target area C can be exposed, without having to compromise on resolution.

Embodiment 2

Figure 2A:
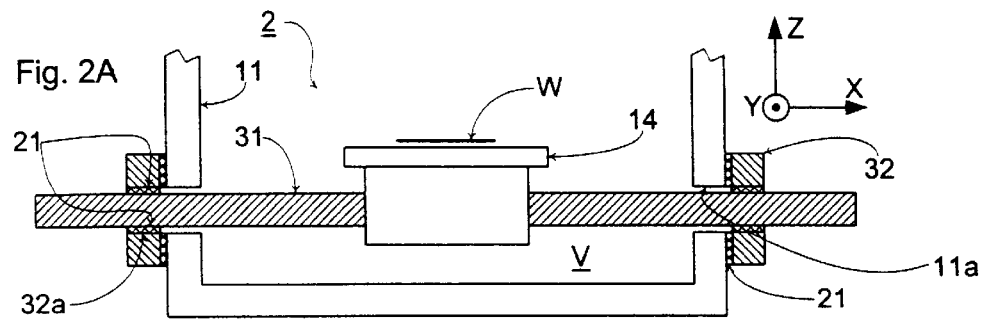
FIG. 2A is a cross-sectional view of a wafer stage of a lithographic projection apparatus according to a second embodiment of the invention.
Figure 2B:
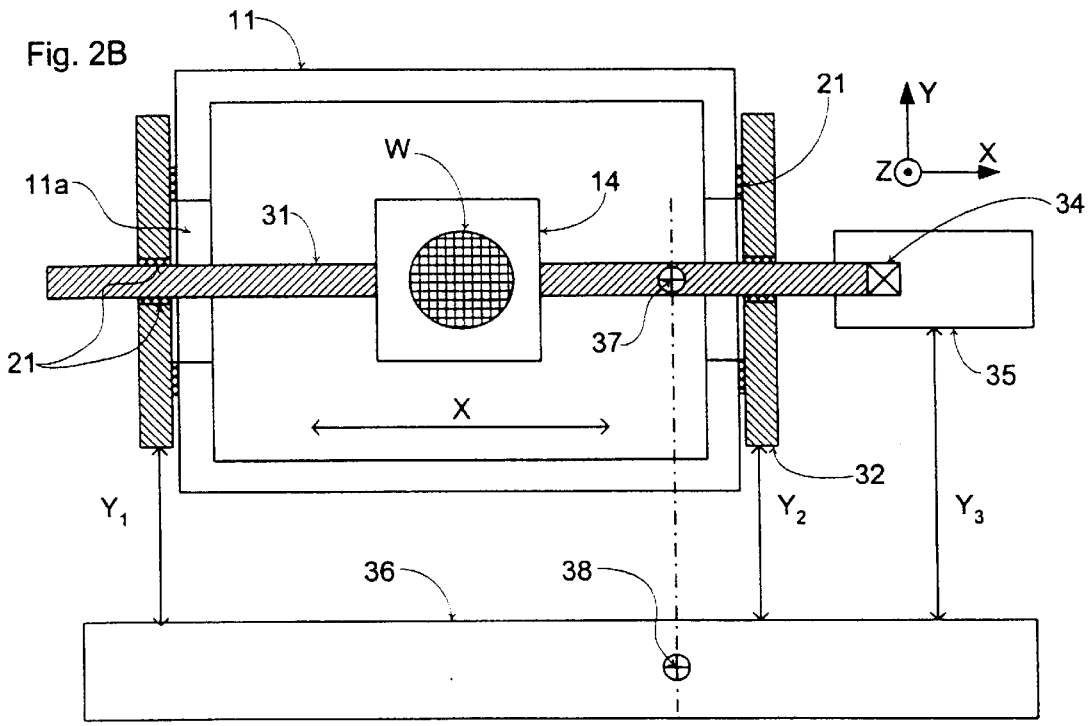
FIG. 2B is a plan view of the wafer stage of FIG. 2A showing the drive arrangements.

The wafer stage of a lithographic apparatus 2 according to a second embodiment of the invention is shown in FIGS. 2A and 2B.

The fine stage, or short-stroke stage, 14 which supports the wafer W is kept in a vacuum chamber V which is bounded by walls 11. During use of the apparatus the vacuum chamber V is kept at a sufficient vacuum by vacuum pumps (not shown) of appropriate type. To allow it to be moved, fine stage 14 is mounted on a horizontal tube 31 which extends across the width of the vacuum chamber V and through elongate horizontal slots 11a defined in the vacuum chamber walls. The tube may be a continuous member about which the fine stage 14 is clamped or may be formed from two half-tubes mounted on and extending from opposite sides of the fine stage.

Long-stroke X-direction movement of the fine stage 14 is accomplished by translating the tube 31 longitudinally and for this reason the tube 31 is sufficiently long to ensure that it projects out of the vacuum chamber throughout the X-direction long-stroke movement range.

Lateral translation of the tube 31 effects the long-stroke Y-direction movement of the fine stage 14 and, by providing separately controllable drives at the two ends of the tube, rotational $\phi_z$ control can also be effected.

The slots 11a must therefore be of sufficient length to allow the desired Y and $\phi_z$ control. The slots 11a are sealed by sliders 32 which are elongate plates having a central through-hole 32a through which the tube 31 projects. The sliders 32 are longer than the slots 11a by at least twice the Y-direction long-stroke movement range, plus the width of the necessary bearing and vacuum seal, to ensure that the slots are sealed throughout the long-stroke movement range.

In this embodiment of the invention, the tube is constructed from sintered $Al_2O_3$ with an outer diameter of 160 mm and an inner diameter of 140 mm. Other suitable materials, such as SiC foam, may also be used. The "active" length of the tube, i.e. the length between the support at slider 32 and the fine stage 14, will average 650 mm, and the total tube mass, including the long-stroke motor parts, will be about 30 kg. It can readily be calculated that this tube will support a fine stage of mass 50 kg with deflections of the order of only 4 $\mu$m at an acceleration of 2 ms$^{-2}$. The resonant frequency of the tube will be of the order of 150 Hz.

As shown in FIG. 2B the X-direction movement of the tube 31 is effected by a linear motor 34 mounted on one end of the tube 31 and acting against magnets (not shown) provided on X-balance mass 35. The $Y_1$ and $Y_2$ drives are arranged to drive sliders 32 by acting against Y-balance mass 36, and a third drive, $Y_3$, is provided to drive the X-balance mass 35 relative to the Y-balance mass 36. To reduce torsional forces the center of mass 37 of the X-direction moving mass, i.e. fine stage 14, tube 31, balance mass 35 and associated components, is aligned with the center of mass 38 of the Y-direction moving mass, i.e. the sliders 32 and Y-balance mass 36.

The X-direction linear motor 34 allows some play relative to the magnets, of the order of 0.1 mm, in the Y-direction. This means that the $Y_3$ drive, which must exert a much greater force than the $Y_1$ and $Y_2$ drives, need only position the X-balance mass 35 to an accuracy of that order, to avoid compromising the 1 $\mu$m accuracy of the $Y_1$ and $Y_2$ drives. Alternatively, the X-direction motor 34 can be connected to the support tube 31 via an elastic element having a high stiffness in the X-direction and a low stiffness in the Y-direction.

Figure 3:
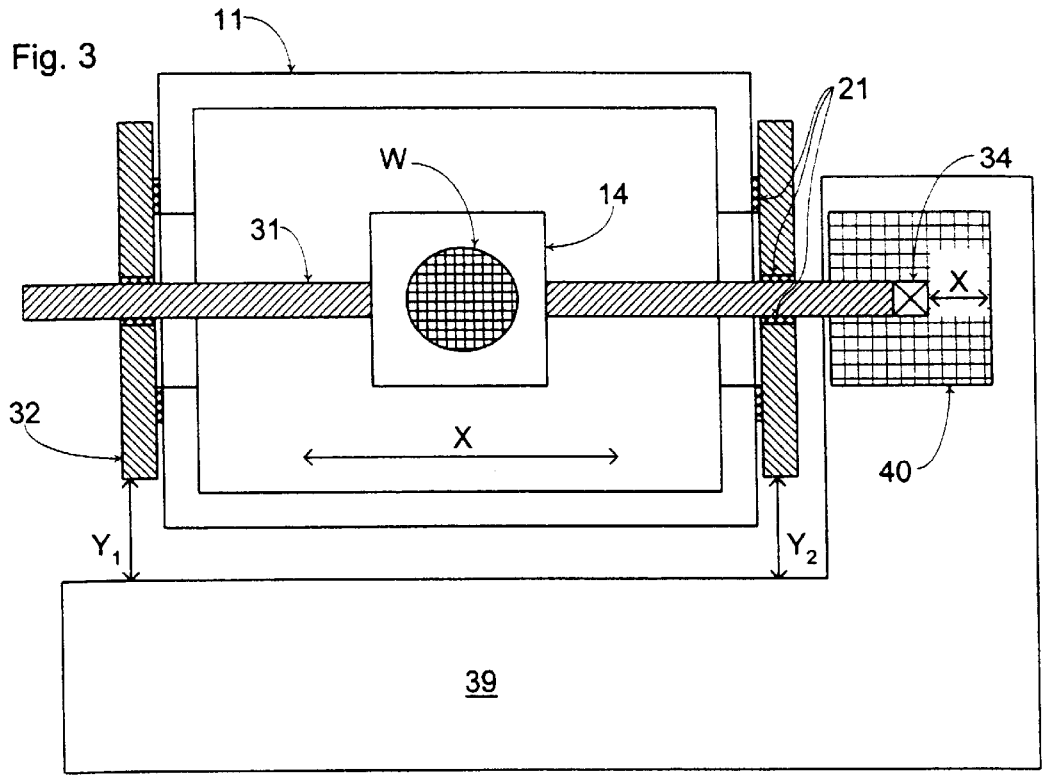
FIG. 3 is a plan view of the wafer stage of FIG. 2A showing alternative drive arrangements.

FIG. 3 depicts an alternative balance mass arrangement in which the X- and Y-balance masses are combined into a single balance mass 39. In this case the magnets 40 for the X-direction linear motor 34 are provided over an area with sides equal to the respective long-stroke movement ranges and the motor dimensions. In this arrangement the control system takes account of variations in motor performance with $\phi_z$ position and also prevents continuous rotation of the balance mass that might occur for certain combinations of set points.

In all the above arrangements, the sliders 32 must be supported off the vacuum chamber wall and allowed to move relative to it. Accordingly, the present invention provides differentially pumped gas (air) bearings 21 around the slots 11 a which are pre loaded by the force exerted by the pressure difference over the area of the wall aperture. These gas bearings 21 are described further below with reference to FIG. 4 and in a European patent Application 99201193.2 entitled "Gas-Bearings for use in Vacuum Chambers and their Application in Lithographic Apparatus" and a concurrently filed U.S. application of similar title (Applicant's ref: P-0133.010) which are incorporated herein by reference. Further gas bearings 21 are provided between the sliders 32 and tube 31 to support the tube and transmit drive forces to it.

Cables (not shown) providing control and measuring signals, as well as other "utilities", to the short-stroke stage 14 can be provided through the hollow interior of the support tube 31.

Figure 4:
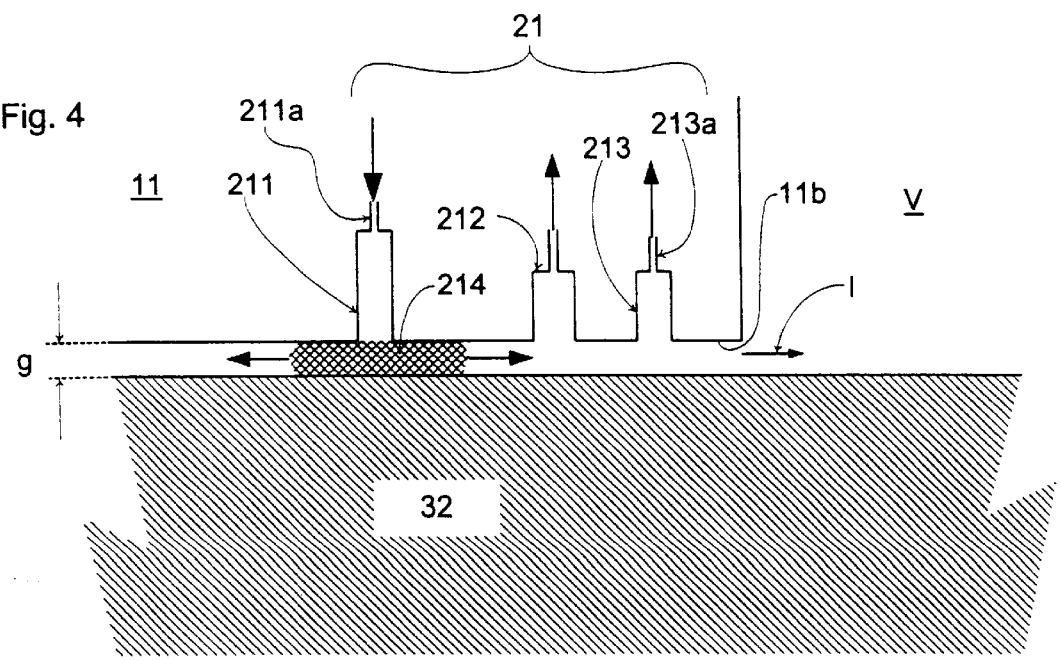
FIG. 4 is a cross-sectional view of a differentially pumped gas bearing used in the wafer stage of FIG. 2A.

As shown schematically in FIG. 4, which is a cross-section through part of the vacuum chamber wall 11 and a slider 32, the sliders 32 are held off the vacuum chamber wall by gas bearings 21 which enable a constant gap, g, of 5 $\mu$m (for example) to be maintained. In some applications a gap in the range of from 5 $\mu$m to 10 $\mu$m may be appropriate. Clean air (or other gas, e.g. $N_2$) is supplied continually through air feed 211 at a pressure of several atmospheres to generate a high pressure region 214. The supplied air will flow towards the exterior and also the vacuum chamber V, where its presence would, of course, be undesirable. An escape path to atmospheric pressure is provided via groove 212. To prevent further the air that forms the air bearing becoming an unacceptable leak into the vacuum chamber V, it is pumped away via vacuum conduit 213. If desired, the escape path 212 may also be pumped. In this way, the residual leakage, l, into the vacuum chamber V can be kept within acceptable levels.

In this embodiment the lower parts of the air feed 211 and the vacuum conduit 213 as well as the expansion chamber 212 are elongate grooves extending along the entire length of the perimeter of the seal. Air feed pipes 211a and vacuum pipes 213a are provided at intervals along the grooves.

In a variation to this embodiment, the air feeds that provide the gas bearing are discrete. At the end of each air feed pipe there is a cylindrical enlargement that is filled with a porous plug. The porous plug is preferably made of graphite, which enables it to be placed in the enlargement after machine finishing of the lower surface 11b of the vacuum wall 11 and then scraped smooth.

In both variants of the gas bearing described above, a single vacuum groove 213 is provided between the air feed 211 and the vacuum chamber V. In other variants, two or more vacuum grooves may be provided, with those nearer the vacuum chamber V being pumped to higher vacuum levels.

Figure 5:
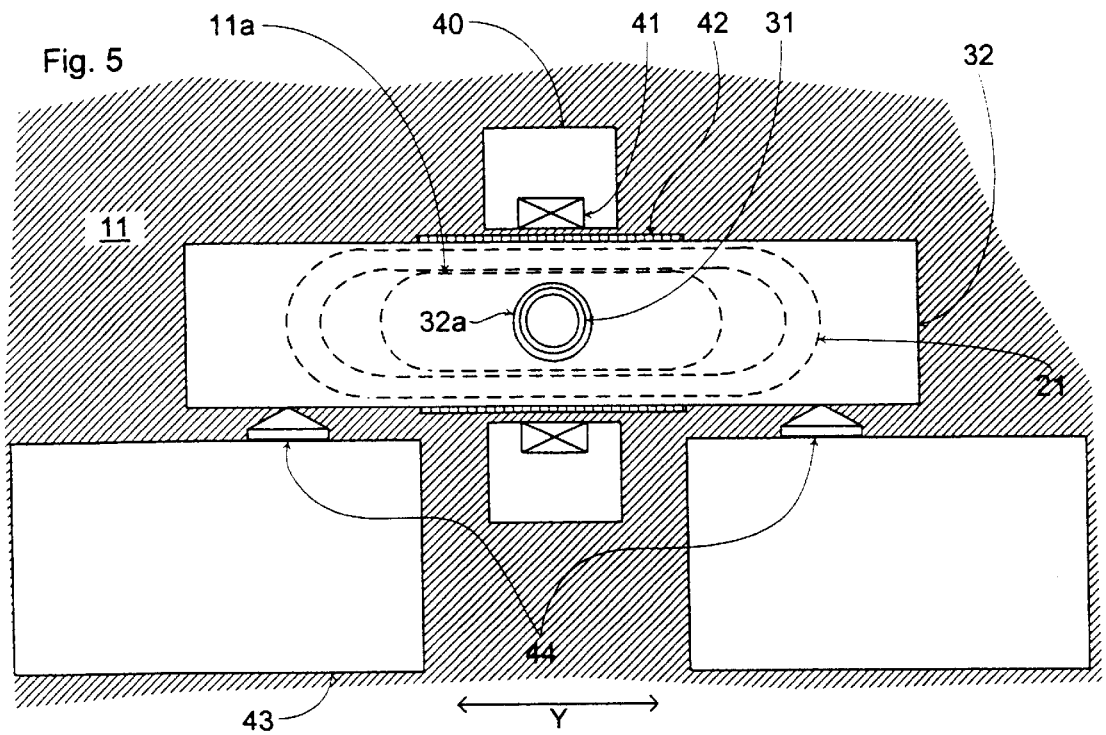
FIG. 5 is a partial side view of the wafer stage of FIG. 2A, showing the Y-direction drive arrangements.

As mentioned above, in this embodiment the sliders 32 are driven for optimum accuracy of Y-positioning. FIG. 5 is a partial side view of the drive arrangements for this. Slider 32 is supported on mounts 43 by conventional gas bearing feet 44 which allow movement in the Y-direction. The motive force is provided by linear motors 41, mounted on supports 40 (one above and one below the slider 32), which act against magnet arrays 42 mounted on the upper and lower surfaces of the slider 32. The mounts 43 as well as the motor supports 40 are extensions of the balance mass 35, 36 or 39.

Figure 6:
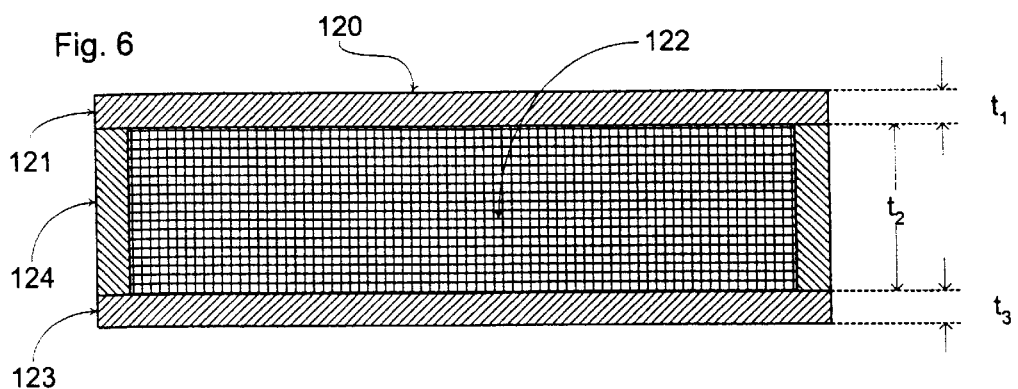
FIG. 6 is a cross-sectional view of an alternative slider usable in the invention.
Figures 6A, 6B:
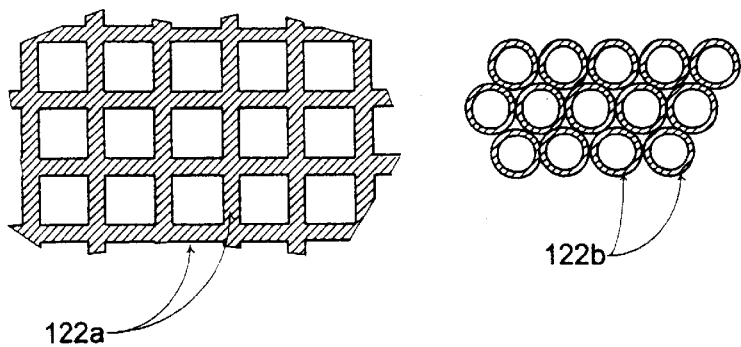
FIGS. 6A and 6B are plan views of alternative fillings for the slider of FIG. 6.

To minimize deformation of the sliders 32 they can be manufactured from a plate 120 having a sandwich structure, as shown in FIG. 6. The upper and lower skin plates 121, 123 are each formed of solid plates of sintered $Al_2O_3$, for example, with respective thicknesses $t_1$ and $t_3$. The sandwich filling 122 is of thickness $t_2$ and may be of various materials, such as a grid structure of $Al_2O_3$ walls 122a, as shown in FIG. 6A, or close-packed hollow glass cylinders 122b, as shown in FIG. 6B. Other alternatives include glass and ceramic foams, for example. In each variation, the primary function of the sandwich filling is to transmit shear forces between the two skin plates 121, 123 and so the material and structure chosen must have a high modulus of elasticity, E.

For a plate 120 with a sintered $Al_2O_3$ grid structure filling, the strength, stiffness and mass of the plate are dependent on the space factor, $\Delta$, which is defined as the total cross-sectional area of the grid structure divided by the total cross-sectional area of the plate, and is used to correct the equations for shear and bending deformation.

According to the invention, the sandwich plate 120 has continuous side walls 124 or else the edges of the sandwich filling 122 are sealed so as to form a hermetic seal for the interior. Prior to the sealing of the interior, it is evacuated to a relatively high vacuum level. This prestresses the sandwich structure and prevents a pressure differential across one skin plate, when the plate is used as a seal for a vacuum chamber, that would tend to delaminate the sandwich structure. The plate may be constructed to ensure that the vacuum inside remains sufficiently high for the entire expected life of it, or a valve may be provided to allow re-evacuation of the interior as necessary It will be appreciated that this evacuated sandwich structure has wider application than as the slider of the invention and may, in particular, be used advantageously as the, or part of the, wall, whether sliding or fixed, of any vacuum chamber.

In a slider, the bending stiffness in the Z-direction is most important; some bending in the Y direction can be permitted to allow the slider 32 to follow any deformations in the vacuum chamber wall 11 or the bearing for the slider 32. The aperture 11a in the vacuum chamber wall 11 is "race-track" shaped, i.e has straight sides with curved ends corresponding to the curvature of the tube 31. The gas bearing 21 is therefore also "race-track" shaped. The span in the Z-direction across the "race-track" shaped gas bearing 21 is 365 mm, which allows for a slot height of 200 mm, to accommodate the tube diameter of 160 mm, and a 65 mm vacuum seal gap each side. An $Al_2O_3$ sandwich plate 120 with outer plates 121, 123 of 12 mm thickness and a grid structure 122 filling with space factor $\Delta=0.07$ will provide a maximum deflection at the bearing of less than 2 $\mu$m for a total weight of 82 kg. A similarly stiff solid plate would weigh approximately 150 kg.

Figure 7:
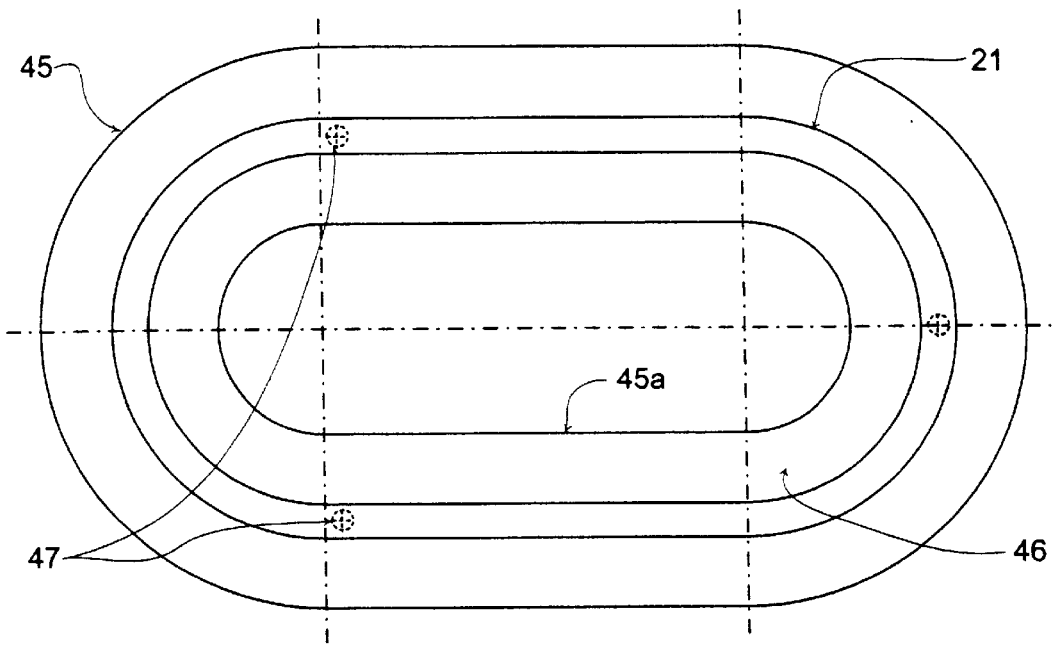
FIG. 7 is a plan view of a slider bearing support useable in the wafer stage of FIG. 2A.

In FIGS. 2A and 2B the slider 32 is supported by a gas bearing formed as an integral part of the vacuum chamber wall 11. This necessitates a wall thickness of a minimum of about 150 mm, assuming a steel wall, to reduce deflections in the bearing to below 5 $\mu$m. In a variation, the gas bearing 32 is provided in a separate bearing support member 45 shown in elevation in FIG. 7. The bearing support 45 is "race-track" shaped and is loaded by the gas bearing 21 which surrounds the vacuum seal margin 46 and the central aperture 45a, which matches the elongate slot 11a in the vacuum chamber wall. The bearing support 45 is mounted on the vacuum chamber wall via three support pads 47 whose placement is determined using finite element analysis, for example. This analysis also shows that a bearing support 45 of thickness 120 mm is sufficient to reduce deflection to about 4 µm or below. A membrane or bellows is provided to form a vacuum seal between the bearing support 45 and the vacuum chamber wall 11, and can be constructed to contribute to the stiffness of the bearing support.

Instead of the support pads 47 a uniform elastic support of relatively low stiffness can be provided. The lower the stiffness of the elastic support the better, but the atmospheric load on the bearing support will cause it to move towards the vacuum chamber wall. Generally, only a few tenths of a millimeter of such movement is tolerable. For a total atmospheric pressure load on the bearing support of 26.5 kN, the total support stiffness should be $\geq 1.3 \times 10^8$ Nm$^{-1}$. The elastic support reduces the effect on the bearing support of any non-flatness in the vacuum chamber wall, and so in this variant the vacuum chamber wall need only be finished to a flatness of order 0.01 mm.

Figure 8:
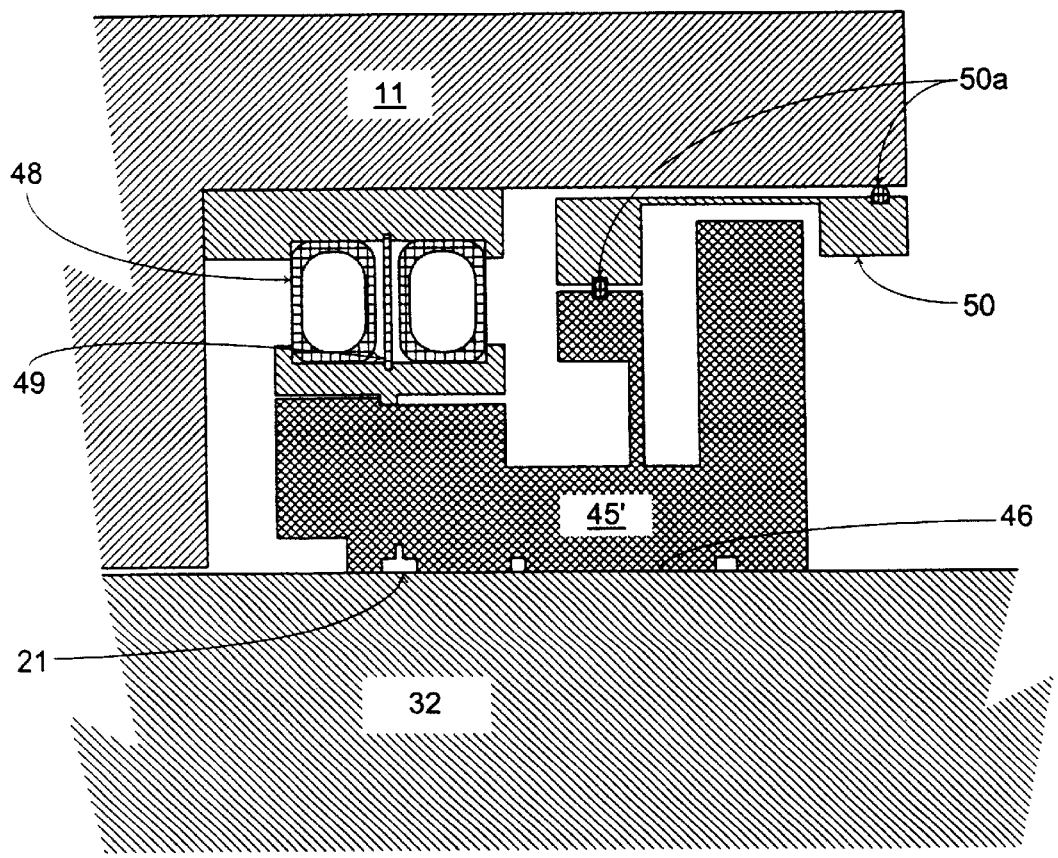
FIG. 8 is a cross-sectional view of an alternative mounting arrangement for a slider bearing support.

A further alternative means of mounting the bearing support 45' is shown in partial cross-section in FIG. 8. In this arrangement the pressure load is compensated for by, for example, two continuous pneumatic tubes 48 which surround the entire periphery of the bearing support 45'. Additional support to fix the bearing support 45 relative to the vacuum chamber wall 11 in the plane of the wall is provided by three spaced-apart bars 49 (only one shown). The vacuum chamber V is sealed by vacuum seal 50, which seals to the vacuum chamber wall 11 and bearing support 45' via O-rings 50*a*. This arrangement provides a support of very well defined stiffness, and minimal transfer of non-flatness in the vacuum chamber wall to the bearing support 45.

It should be noted that the above bearing support arrangements are not limited in applicability to the above described apparatus. The described bearing supports may be used and provide advantages in any apparatus where a bearing must be provided around an aperture, of any shape or size, in a vacuum chamber wall.

Embodiment 3

The wafer stage of a third embodiment of a lithography apparatus 3 according to the invention is shown in cutaway in FIG. 9. This embodiment is similar in concept to the second embodiment described above, but utilizes two tubes 331*a* and 331*b* to support the fine stage 14. This reduces the height of the wafer stage and also the diameter of the tubes 331*a* and 331*b*. This in turn means the slots 11*a* can be narrower, but must be of increased length. In this particular embodiment the sliders 332 are supported by gas bearings 321 in insets to the vacuum chamber walls 11. Gas bearings are also provided to support the tubes 331*a* and 331*b* and allow translation in the X-direction.

Cables 20 carrying control signals and other "utilities" to the fine stage 14 can be passed through one or both of the tubes 331*a* and 331*b*.

Embodiment 4

In the above embodiments the net cross-sectional areas of the support tube or tubes at the vacuum chamber wall on either side of the fine stage 14 are the same. There is therefore no net pressure force on the fine stage in the X-direction. However, in an embodiment of the invention that is to be used with vertical masks or wafers, the support tube or tubes can be arranged vertically and the lower tube given a larger cross-section, at least in the length that will pass through the vacuum chamber wall. This will provide a net upward pressure force which can be arranged to compensate for the weight of the fine stage and support tube(s), etc.

The invention is described above in relation to preferred embodiments, however it will be appreciated that the invention is not limited by the above description. In particular, the invention has been described above in relation to the wafer stage of a lithographic apparatus but is equally applicable to the mask stage of such an apparatus or to any apparatus in which a long-stroke manipulator must be fed-through into a vacuum chamber.

We claim:

1. A lithographic projection apparatus, comprising:
   an illumination system;
   a first object table arranged in an illumination path from said illumination system;
   a second object table arranged in an optical path from said first object table;
   a projection system arranged in said optical path between said first and second object tables;
   a vacuum chamber enclosing at least one of said first and second object tables;
   a support member extending in said vacuum chamber and supporting said at least one of said first and second object tables; and
   a cable arranged within said support member,
   wherein said cable is in communication with said at least one of said first and second object tables enclosed in said vacuum chamber from outside of said vacuum chamber.

2. An apparatus according to claim 1, wherein said cable provides at least one of control signals, measuring signals and utilities to said at least one of said first and second object tables.

3. An apparatus according to claim 1, wherein said vacuum chamber has two wall apertures in opposing walls, and said support member extends through both said wall apertures so that first and second member ends are outside said vacuum chamber and a medial portion of said support member is inside said vacuum chamber.

4. An apparatus according to claim 1, wherein said vacuum chamber comprises at least one wall aperture, said at least one wall aperture comprising an elongate slot whereby said support member can be displaced laterally along said slot and longitudinally in and out of said slot.

5. An apparatus according to claim 4, further comprising a seal constructed and arranged to seal said at least one wall aperture, said seal comprising a sliding seal plate and a bearing provided between said sliding plate and a vacuum chamber wall to allow movement of said sliding seal plate.

6. An apparatus according to claim 5, wherein said bearing comprises a gas bearing for maintaining a predetermined clearance to said vacuum chamber wall, and an evacuating device provided between said gas bearing and said vacuum chamber wall, said evacuating device reducing leakage of gas from said gas bearing into said vacuum chamber.

7. An apparatus according to claim 6, further comprising a bearing support member provided on said vacuum chamber wall surrounding said at least one wall aperture, wherein said gas bearing is provided in said bearing support member.

8. An apparatus according to claim 7, wherein said bearing support member is mounted on said vacuum chamber wall and further comprises a bellows or membrane seal to provide a vacuum seal between said bearing support member and said vacuum chamber wall.

9. An apparatus according to claim 7, wherein said bearing support member is mounted on said vacuum chamber wall by an elastic support, said elastic support having a stiffness much less than a stiffness of said bearing support member.

10. An apparatus according to claim 7, wherein said bearing support member is mounted on said vacuum chamber wall by a low-stiffness support for exerting force on the bearing support member substantially perpendicular to said vacuum chamber wall, and by a mechanical linkage for constraining movement of said bearing support member substantially parallel to said vacuum chamber wall.

11. An apparatus according to claim 10, wherein said low-stiffness support comprises at least one continuous member surrounding said at least one wall aperture and filled with gas at a pressure sufficient to exert said substantially perpendicular force; and said mechanical linkage comprises a plurality of spaced-apart tie rods connecting said bearing support member to said vacuum chamber wall.

12. An apparatus according to claim 5, wherein said sliding seal plate has a plate aperture and said support member extends through and is closely received by said plate aperture whereby said support member is displaceable longitudinally relative to said plate but is constrained laterally; and comprising a positioning assembly having an X-direction motor acting on said support member to cause longitudinal displacement thereof and a Y-direction motor acting on said sliding seal plate to cause lateral displacement of said support member.

13. An apparatus according to claim 12, wherein said X-direction motor and said Y-direction motor act against X- and Y-direction balance masses respectively; and further comprising a balance mass motor acting between the X- and Y-direction balance masses for moving them in synchronism with movement of said sliding seal plate by said Y-direction motor.

14. An apparatus according to claim 12, wherein said X- and Y-direction motors act against a single balance mass.

15. An apparatus according to claim 5, wherein said sliding seal plate comprises a sandwich structure having a sealed outer envelope and a porous internal layer, voids in said internal layer being under a vacuum.

16. An apparatus according to claim 15, wherein said porous internal layer is selected from the group consisting of: a grid of transverse walls, an array of hollow cylinders, ceramic foam and glass foam.

17. An apparatus according to claim 1, wherein said support member extends generally vertically into said vacuum chamber and is shaped such that the net pressure force on said support member substantially counteracts a weight of said support member and a total mass it supports.

18. An apparatus according to claim 1, further comprising two substantially parallel laterally-spaced-apart support members for supporting said at least one of said first and second object tables.

19. An apparatus according to claim 1, comprising a positioning assembly constructed and arranged to displace said support member, thereby to displace said at least one of said first and second object tables within said vacuum chamber.

20. An apparatus according to claim 1, wherein said support member comprises a hollow tube.

* * * * *